(12) United States Patent
Ohmi et al.

(10) Patent No.: US 6,494,223 B1
(45) Date of Patent: Dec. 17, 2002

(54) WET CLEANING APPARATUS UTILIZING ULTRA-PURE WATER RINSE LIQUID WITH HYDROGEN GAS

(75) Inventors: Tadahiro Ohmi, 1-17-301, Komegabukuro 2-chome, Aoba-ku, Sendai-shi, Miyagi-ken 980-0813 (JP); Kazuhiko Kawada, Miyagi-ken (JP); Toshihiro II, Miyagi-ken (JP); Masatoshi Hashino, Shizuoka (JP); Noboru Kubota, Shizuoka (JP)

(73) Assignees: Tadahiro Ohmi, Miyagi-ken (JP); Organo Corporation, Tokyo (JP)

( * ) Notice: Subject to any disclaimer, the term of this patent is extended or adjusted under 35 U.S.C. 154(b) by 0 days.

(21) Appl. No.: 09/601,061

(22) PCT Filed: Dec. 1, 1999

(86) PCT No.: PCT/JP99/06721

§ 371 (c)(1),
(2), (4) Date: Sep. 22, 2000

(87) PCT Pub. No.: WO00/33367

PCT Pub. Date: Jun. 8, 2000

(30) Foreign Application Priority Data

Dec. 1, 1998 (JP) .......................... 10-342235
Nov. 26, 1999 (JP) .......................... 11-335491

(51) Int. Cl.⁷ .............................. B08B 3/00; C02F 1/42
(52) U.S. Cl. ...................... 134/201; 134/902; 134/110; 210/638; 210/649; 210/900
(58) Field of Search .............................. 134/2, 10, 60, 134/104.1, 105, 109, 110, 166 R, 201, 902; 210/638, 649, 900

(56) References Cited

U.S. PATENT DOCUMENTS

| | | | |
|---|---|---|---|
| 5,073,268 A | * 12/1991 | Saito et al. | 210/638 |
| 5,242,468 A | * 9/1993 | Clark et al. | 134/102.2 |
| 5,464,480 A | 11/1995 | Matthews | |
| 5,733,521 A | * 3/1998 | Minamikawa et al. | 423/584 |
| 5,954,885 A | * 9/1999 | Ohmi | 134/1 |

FOREIGN PATENT DOCUMENTS

| | | | | |
|---|---|---|---|---|
| JP | 61167404 | * | 7/1986 | |
| JP | 1-1400825 | | 9/1989 | H01L/21/304 |
| JP | 02063586 A | | 3/1990 | B08B/3/08 |
| JP | 06097141 A | | 4/1994 | H01L/21/304 |
| JP | 08089954 A | | 4/1996 | C02F/1/42 |
| JP | 08148456 A | | 6/1996 | H01L/21/304 |
| JP | 08337405 A | * | 12/1996 | |
| JP | 09010713 A | | 1/1997 | B08B/3/12 |
| JP | 09141058 A | | 6/1997 | B01D/61/00 |
| JP | 10128253 A | | 5/1998 | B08B/3/08 |
| JP | 10128253 A | * | 5/1998 | |
| JP | 10272492 A | | 10/1998 | C02F/9/00 |

* cited by examiner

Primary Examiner—Randy Gulakowski
Assistant Examiner—Joseph Perrin
(74) Attorney, Agent, or Firm—Randall J. Knuth (57) ABSTRACT

A wet cleaning apparatus can remove trace heavy metals, colloidal matter or other impurities contained in ultra-pure water to be used as rinse water in semiconductor cleaning processes and suppress deposit of trace impurities such as heavy metals or other particles that would otherwise cause characteristics of such devices to deteriorate. A wet cleaning apparatus for rinsing with ultra-pure water as a rinse liquid by supplying ultra-pure water through a piping to a rinse location inside the apparatus. The rinse location is a point of use of the ultra-pure water. The wet cleaning apparatus includes a module filled with porous film in which polymer chains having at least one of an anion exchange group, a cation exchange group, and a chelating group are held in the middle of the piping positioned inside the apparatus. The wet cleaning apparatus further includes a means for adding hydrogen gas to the rinse liquid.

4 Claims, 3 Drawing Sheets

WET CLEANING APPARATUS UTILIZING ULTRA-PURE WATER RINSE LIQUID WITH HYDROGEN GAS

BACKGROUND OF THE INVENTION

1. Field of Invention

The present invention concerns a cleaner using ultra-pure water, and particularly a cleaner for use in the wet cleaning process for the semiconductor industry.

2. Discussion of the Related Art

It has been devised to introduce, just before the point of use, an ion absorption film module filled with a porous film of 0.01 to 1 µm in average hole diameter, the porous film holding polymer chains having a cation exchange group, an anion exchange group and a chelating group (hereafter, called cation absorption film, anion absorption film and chelate film, respectively); and each such film being generically called an ion absorption film for reducing impurities such as heavy metals, for example, just before the point of use (Japanese Patent Laid-Open No. HEI 8-89954).

A hollow yarn film module having a cation exchange group associated therewith is applied to eliminate metals, and it is particularly effective in eliminating alkali metals and/or alkali earth metals. A hollow yarn film module having an anion exchange group can effectively eliminate particles and colloidal matter. A hollow yarn film module having a chelating group has an excellent function of eliminating heavy metal material, even when present at an extremely low concentration.

It is known that the use of hydrogenated ultra-pure water can suppress and/or eliminate deposition onto a substance of silicon or the like. Further, Japanese Patent Laid-Open No. HEI 9-10713 discloses a method including the steps of presenting an extremely high hydrocarbon elimination rate and by treating the wafer with ultra-pure water in order to perform substrate hydrogen termination, the ultra-pure water containing hydrogen or a mixture of hydrogen and a rare gas. As hydrogenated ultra-pure water presents an extremely high hydrocarbon elimination rate, using a rinse of hydrogenated ultra-pure water should allow a cleaner wafer surface to be obtained than possibly achieved using a rinse not employing hydrogenated ultra-pure water.

However, through the comparison between a film (for example, an insulation film such as a gate insulation film) formed on the silicon substrate when hydrogenated ultra-pure water is used to rinse and a film formed on the substrate when non-hydrogenated ultra-pure water is used to rinse, the Inventors have found a problem that the former film happens to be inferior to the latter film in quality (for example, dielectric strength).

They have investigated the cause thereof and have found that the hydrogenated ultra-pure water is capable of eliminating particles and/or of preventing particles from depositing on a substrate, but also has a function of facilitating deposition of metallic impurities onto the substrate. They have explicated that this deposition provokes film quality degeneration (for example, deterioration of dielectric strength).

SUMMARY OF THE INVENTION

The present invention provides a wet cleaning apparatus for eliminating a trace heavy metal, colloidal matter, and/or other impurities contained in ultra-pure water used as rinse water in the semiconductor cleaning process and suppressing deposition of impurities, such as particles and/or heavy metals that degenerate device characteristics, onto the substance surface.

According to the present invention, a wet cleaning apparatus for rinsing with ultra-pure water includes a piping through which is supplied to a point of use inside the apparatus, the piping being provided with a module filled with a porous film in which polymer chains having at least one of a cation exchange group, an anion exchange group and a chelating group held within the polymer chains, the porous film being positioned in the middle of the piping.

Here, the cleaner is a multi-tank type, a single tank type batch cleaner, or a sheet cleaner for performing wet cleaning. In wet cleaning, the cleaner is an apparatus for cleaning a wafer surface with ultra-pure water-based chemicals, for rinsing surface chemical deposits therefrom with the ultra-pure water and eventually for drying the wafer surface. Note that such an apparatus includes a cleaner for cleaning by ultra-pure water jet.

Here, the cleaner includes a wet bench. A wet bench is a cleaning place provided with exhaust equipment and cleaning equipment. The cleaning equipment is provided with ultra-pure water, chemical supply piping, and drain piping for cleaning liquid and rinse water.

Ultra-pure water produced by the ultra-pure water system always circulates within the main loop and is extracted as necessary from the main loop by means of a branch piping to dilute chemicals necessary for cleaning or rinsing, as appropriate.

Branch piping is introduced into the cleaner or wet bench to supply ultra-pure water for individual cleaning processes, and among them, in the final rinse corresponding to the final process of the cleaning processes, it is an object to eliminate any chemical deposit from the semiconductor substrate that would otherwise exist thereon after cleaning.

Here, the final rinse designates the process for rinsing a chemical deposit on the wafer surface with ultra-pure water or hydrogenated ultra-pure water just before a wafer drying process, such as IPA (2-propanol) vapor drying, spin drying, or Marangoni-type drying.

As the rinse with ultra-pure water itself does not present an effect to suppress deposition of impurities such as various types of metal, rinsing water after chemical cleaning should be free from even a trace of impurities.

Especially, in the last process of wet cleaning, the substrate surface is etched with dilute hydrofluoric acid solution, a bare silicon surface, deprived of an oxide film, is exposed, and thereafter, the rinse process is performed with ultra-pure water.

There, the object of ultra-pure water rinse is to eliminate hydrofluoric acid chemical deposited on the substrate by rinsing with ultra-pure water. However, if impurities such as metals exist in the ultra-pure water, the use thereof can result in impurity deposition since the silicon surface is exposed. Once impurities deposit onto the substrate, the ultra-pure water is totally incapable of eliminating them. Consequently, the ultra-pure water used for the final rinse is required to be totally free from impurities such as metals that tend to deposit onto the substrate surface.

Among impurities present in the ultra-pure water, especially metals, are reduced and hardly detected, even by means of a high sensitivity instrument analyzer such as an inductively coupled plasma analyzer (ICP-MS).

It is presumed that the presence of impurities under the analyzer quantification lower limit level provokes the deposition of impurities onto the substrate surface.

Almost all metals existing in the ultra-pure water are generally anionized. However, it is presumed that they do not exist as independent anions, but they are clustered or colloidalized, forming electrostatically weak binding with silica or organic matter having negative charge. For this reason, it is difficult to remove the clustered matter having weak charge and small size with ion exchange or reverse osmosis equipment designed to remove metal impurities in the ultra-pure water system. It has been found that these metal impurities are present at the exit of ultra-pure water system and may deposit onto the substrate surface.

Here, the investigation by the Inventors has shown that the use of a module filled with an ion absorption film holding polymer chains having at least have of a exchange group, an anion exchange group and a chelating group can eliminate impurities, such as a clustered metal, that could not be removed by the conventional system.

Here, as the ion absorption film used in the present invention, for example, a hollow yarn porous film of 0.01 to 1 $\mu$m in average hole diameter is used preferably, the porous film containing polymer chains having ion exchange groups inside the film, the ion exchange groups forming 0.2 to 10 mili-equivalent weight per 1 gram of film. The manufacturing method and other details thereof are as described in the document JAPANESE PATENT LAID-OPEN NO. HEI 8-89954.

As for ion absorption film, for example, it concerns one having quaternary anime as an exchange group, and quaternarized chloromethyl styrene is generally used. However, those obtained by quaternarizing azote atoms of pyridine-based or imidazole-based heterocyclic rings can also be used.

As for a potential cation absorption film, a sulfonic group, phosphoric group, carboxylic group or the like are advantageously used as the exchange group.

Concerning a usable chelating group, an iminodi acetic group, mercapto group, ethylene diamine or the like can be used as the exchange group.

Figure 1:
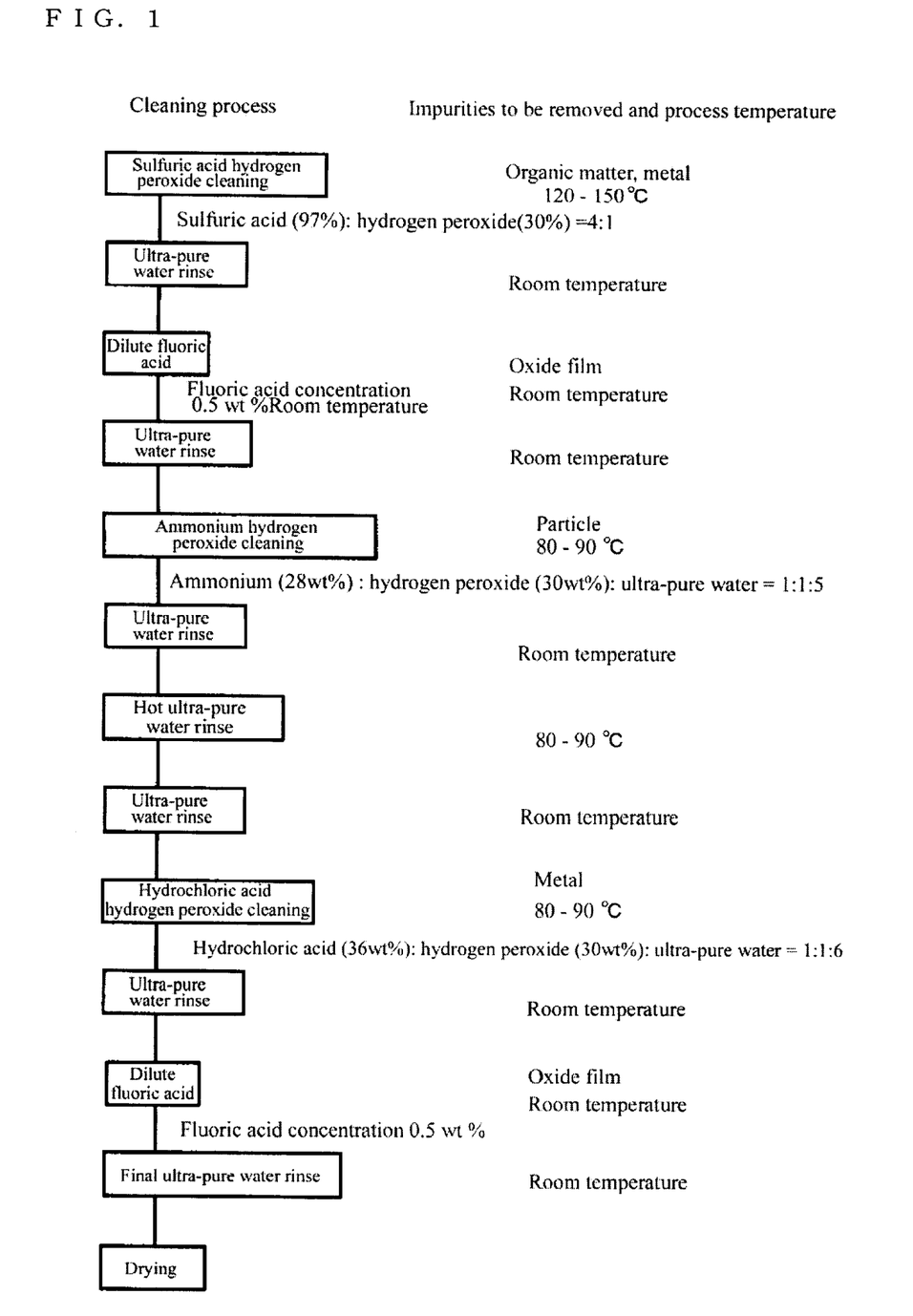
FIG. 1 is a process diagram showing the cleaning procedure of the present invention.

As a wet cleaning method in the semiconductor production, a cleaning method called RCA cleaning, shown in FIG. 1, has been used conventionally. This RCA cleaning is characterized by blending acid or alkali on the base of hydrogen peroxide, and cleaning at a high temperature, and repeating ultra-pure water rinsing following chemical cleaning.

The role of ultra-pure water rinse is nothing other than the removal of used chemicals from the substrate. However, as the rinse process hardly removes impurities other than the chemical solution, it is required to supply cleaned ultra-pure water. Especially, if the contamination occurs in the final rinse, all cleaning processes should be performed over again. Consequently, it is necessary to take some measures against recontamination.

In order to improve the quality of ultra-pure used for a final rinse, the problem of ineffective cleaning in the wet cleaning can be resolved by integrating these ion absorption film modules into the ultra-pure water piping for final rinse in a cleaner.

In a cleaner according to the present invention, ultra-pure water is first treated by a module filled with ion absorption film holding polymer chains having at least one of a cation exchange group. An anion exchange group and a chelating exchange group acting as an exchange group inside the film when hydrogenated ultra-pure water is used in the rinse process of wet cleaning, and then hydrogenated, for instance, when a silicon wafer is to be washed for semiconductor manufacturing.

Hydrogenated ultra-pure water is capable of eliminating particles deposit from a substrate and has an effect to prevent particles from depositing on the substrate, but when metallic impurities are present, it facilitates disadvantageously the deposition of such metallic impurities onto the substrate.

It was found that metal deposition onto the substrate can be suppressed even if hydrogenated ultra-pure water is used, provided that metal impurities present in the ultra-pure water can be reduced sufficiently.

Consequently, according to the present invention, the deposition of not only particles but also metal impurities can be suppressed. Besides, an insulation film having, for instance, a high dielectric strength can be formed on the substrate even when the final rinse is performed by the wet cleaning apparatus of the present invention.

Therefore, a cleaning method wherein ultra-pure water is hydrogenated after having sufficiently reduced metal impurities in the ultra-pure water through the treatment with a module filled with ion absorption films and a cleaner capable of carrying out that cleaning method have been invented.

Moreover, the ultra-pure water is first hydrogenated when hydrogenated ultra-pure water is used in the rinse process of wet cleaning and then treated by a module filled with an ion absorption film holding polymer chains having at least one of a cation exchange group, an anion exchange group and a chelating group as an exchange group inside the film, when a silicon wafer is to be washed for semiconductor manufacturing.

A combination of any two or more modules filled with an ion absorption film holding polymer chains having at least one of cation exchange group, an anion exchange group and a chelating group can be used in the cleaner or wet bench, when a silicon wafer is to be washed for semiconductor manufacturing.

As for the metal present in the ultra-pure water, though the metal itself is ionized and becomes cationic, matter like negatively charged silica or organic acid approaches around the metal, clusters and exists in a colloidal state.

As charge deviation varies according to the nature of the metal element paired with silica or organic matter, a complete removal may not be assured by a single film module. However, in such a case, the metal can be eliminated completely by combining films whereby different exchange groups are introduced. As a possible combination in one method, two kinds of films can be combined as follows:
Cation absorption film+anion absorption film;
Chelate film+anion absorption film;
Anion absorption film+cation absorption film;
Anion absorption film+chelate film;
Cation absorption film+chelate film; and
Chelate film+cation absorption film
and, in another method, three kinds of films can be combined as follows:
Cation absorption film+chelate film+anion absorption film;
Chelate film+cation absorption film+anion absorption film;
Cation absorption film+anion absorption film+chelate film;
Anion absorption film+cation absorption film+chelate film;
Anion absorption film+chelate film+cation absorption film; and
Chelate film+anion absorption film+cation absorption film.
However, the combination preferably includes a chelate film to eliminate impurities.

Ultra-pure water hydrogenation can take place either upstream of the module or downstream of the module. If it is performed upstream, the metal deposition onto the substrate can be prevented more effectively. Note that the hydrogenated ultrapure water includes water hydrogenated from exterior and one containing hydrogen from the beginning of the manufacturing.

NOTIFICATION OF SYMBOLS 1,2,3,4,5 Cleaning tank
6 Ozone generator
7 Ultra-pure water piping
8 Mixing tank
9 Mixing tank
10,12 Fluoric acid weighing tank
11 Hydrogen weighing tank
13 Piping
19 Hydrogen dissolution film module
20,21,22 Ion absorption module

DETAILED DESCRIPTION OF THE INVENTION

In the examples, an anion absorption film, a cation absorption film and/or a chelate film are used as the ion absorption film. These ion absorption films are prepared according to the method described in T. Hori et al., Journal of Membrane Science 132 (1997) 203 211.

An anion absorption film has a structure wherein a polymer chain is obtained by introducing a strong basic quaternary ammonium-type ion exchange group into a copolymer of chloromethyl styrene, and divinyl benzene is fixed onto the hollow yard porous film surface.

A cation absorption film has a structure wherein a polymer chain is obtained by introducing a strong sulfonic acid-type ion exchange group into a copolymer of styrene, and divinyl benzene is fixed onto the hollow yarn porous film surface.

A chelate film has a structure wherein a polymer chain is obtained by introducing an iminodi acetic group into a copolymer of glycidyl methacrylate, and divinyl benzene is fixed onto the hollow yarn porous film surface.

EXAMPLE 1

Figure 2:
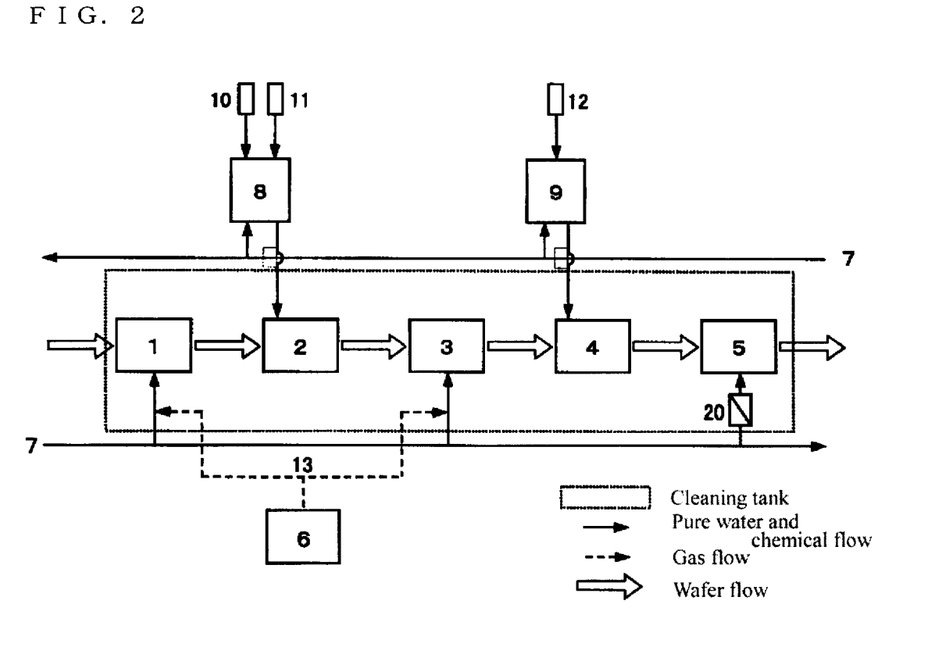
FIG. 2 is a schematic diagram showing a cleaning system used in Example 1.

FIG. 2 shows a cleaner for performing ambient temperature wet cleaning, accommodating five steps and thereby having cleaning tanks 1 to 5 in the cleaning machine.

Cleaning with ozone ultra-pure water is performed in cleaning tank 1, and megasonic irradiation cleaning is performed by adding surfactant to a fluoric acid-hydrogen peroxide mixture solution in cleaning tank 2.

Cleaning is performed with ozone ultra-pure water in cleaning tank 3, dilute fluoric acid treatment in cleaning tank 4, and a final ultra-pure water rinse in cleaning tank 5.

Cleaning tank 1 and cleaning tank 3 are supplied with ultra-pure water from an ultra-pure water piping 7. Ozone generated by an ozone generator 6 and ozone supplied from a piping 13 are mixed and dissolved in the ultra-pure water piping 7 and supplied into cleaning tank 1,3 as ozone ultra-pure water.

A mixing tank 8 is installed in association with cleaning tank 2, and mixing tank 8 is suitably supplied with necessary chemicals from a weighing tank 10 of fluoric acid-containing surfactant and from a weighing tank 11 of hydrogen peroxide, and when mixing is finished, the chemicals are transported from mixing tank 8 to cleaning tank 2.

A mixing tank 9 is installed relative to cleaning tank 4, and mixing tank 9 is suitably supplied with the necessary chemicals from a weighing tank 12 of fluoric acid, and when mixing is finished, the chemicals are transported from mixing tank 9 to cleaning tank 4.

Cleaning tank 5 (i.e., point of use in final rinse) is supplied with ultra-pure water from ultra-pure water piping 7, and the dissolved oxygen concentration of this ultra-pure water was 2 $\mu$g/L.

An anion absorption film module is introduced, as ion absorption film module 20, between a supply outlet to cleaning tank 5, and 0.1 $\mu$m particle elimination membrane filter 21 in a branch piping 7 inside a cleaning machine, supplying cleaning tank 5 with ultra-pure water, all the ultra-pure water being filtered by module 20 before introduction into cleaning tank 5.

First, cleaning with ozone ultra-pure water in cleaning tank 1 through cleaning with dilute fluoric acid in cleaning tank 4 is performed on a silicon wafer (prepared by a taking up method) of 8 inches in diameter (cz), having an n-type crystal face (100) and a resistivity of 8 to 12 $\Omega$·cm. Next, the cleaning is performed by changing the rinse time with the ultra-pure water in cleaning tank 5 from 10 minutes, 1 day, 3 days, to 7 days. After rinsing, the silicon wafer is dried, and the quantity of metal impurities such as copper, iron or nickel, among the deposited impurities, is measured by a total reflection X-ray spectrometer, the results thereof being shown in Table 1.

EXAMPLE 2

In the same cleaner as Example 1, a cation absorption film module is introduced, as ion absorption film module 20, between the supply outlet to tank 5 and 0.1 $\mu$m particle elimination membrane filter 21 in branch piping 7 inside cleaning machine, supplying cleaning tank 5 with ultra-pure water, all the ultra-pure water being filtered by module 20 before introduction into cleaning tank 5.

First, cleaning with ozone ultra-pure water in cleaning tank 1 through cleaning with dilute fluoric acid in cleaning tank 4 is performed upon a 8 inch, n-type (100), 8 to 12 $\Omega$·cm silicon wafer. Next, the cleaning is performed by changing the rinse time with the ultra-pure water in cleaning tank 5 from 10 minutes, 1 day, 3 days, to 7 days. After rinsing, the silicon wafer is dried, and the quantity of metal impurities such as copper, iron or nickel, among deposited impurities, is measured by a total reflection X-ray spectrometer, the results thereof being shown in Table 1.

EXAMPLE 3

In the same cleaner as used in Example 1, a film module having a chelating group is introduced, as ion absorption film module 20, between a supply outlet to cleaning tank 5 and 0.1 $\mu$m particle elimination membrane filter 21 in branch piping 7 inside the cleaning machine, supplying cleaning tank 5 with ultra-pure water, all the ultra-pure water being filtered by module 20 before introduction into cleaning tank 5.

First, cleaning with ozone ultra-pure water in cleaning tank 1 through cleaning with dilute fluoric acid in cleaning tank 4 is performed upon a silicon wafer, prepared by a taking up method, the silicon wafer being 8 inches in diameter (cz) and having an n-type crystal face (100) and resistivity of 8 to 12 Ω·cm. Next, the cleaning is performed by changing the rinse time with the ultra-pure water in cleaning tank 5 from 10 minutes, 1 day, 3 days, to 7 days. After rinsing, the silicon wafer is dried, and the quantity of metal impurities such as copper, iron or nickel, among the deposited impurities, is measured by a total reflection X-ray spectrometer, the results thereof being shown in Table 1.

Comparative Example 1

In the same cleaner as Example 1, ultra-pure water is supplied without introducing an ion absorption module.

First, cleaning with ozone ultra-pure water in cleaning tank 1 through cleaning with dilute fluoric acid in the cleaning tank 4 is performed upon a silicon wafer, prepared by a taking up method, of 8 inches in diameter (cz) and having an n-type crystal face (100) and a resistivity of 8 to 12 Ω·cm. Next, the cleaning is performed by changing the rinse time with the ultra-pure water in cleaning tank 5 from 10 minutes, 1 day, 3 days, to 7 days. After rinsing, the silicon wafer is dried, and the quantity of metal impurities such as copper, iron or nickel, among the deposited impurities, is measured by a total reflection X-ray spectrometer, the results thereof being shown in Table 1.

Comparative Example 2

In the same cleaner as Example 1, an anion absorption film module is introduced, as ion absorption film module 20, in branch piping 7 supplying cleaning tank 5 with ultra-pure water but positioned outside the cleaning machine, all the ultra-pure water being filtered by module 20 before introduction thereof into cleaning tank 5.

First, cleaning with ozone ultra-pure water in cleaning tank 1 through cleaning with dilute fluoric acid in cleaning tank 4 is performed upon a silicon wafer, prepared by a taking up method of 8 inches in diameter (cz) and having an n-type crystal face (100) and a resistivity of 8 to 12 Ω·cm. Next, the cleaning is performed by changing the rinse time with the ultra-pure water in cleaning tank 5 from 10 minutes, 1 day, 3 days, to 7 days.

After rinsing, the silicon wafer is dried, and the quantity of metal impurities such as copper, iron or nickel, among the deposited impurities, is measured by a total reflection X-ray spectrometer, the results thereof being shown in Table 1.

Comparative Example 3

In the same cleaner as Example 1, a cation absorption film module is introduced, as ion absorption film module 20, in branch piping 7, supplying cleaning tank 5 with ultra-pure water, but outside the cleaning machine, all the ultra-pure water being filtered by module 20 before introduction thereof into cleaning tank 5.

First, cleaning with ozone ultra-pure water in cleaning tank 1 through cleaning with dilute fluoric acid in cleaning tank 4 is performed upon a silicon wafer, prepared by a taking up method, of 8 inches in diameter (cz) and having an n-type crystal face (100) and a resistivity of 8 to 12 Ω·cm. Next, the cleaning is performed by changing the rinse time with the ultra-pure water in cleaning tank 5 from 10 minutes, 1 day, 3 days, to 7 days. After rinsing, the silicon wafer is dried, and the quantity of metal impurities such as copper, iron or nickel, among the deposited impurities, is measured by a total reflection X-ray spectrometer, the results thereof being shown in Table 1.

Comparative Example 4

In the same cleaner as Example 1, a film module provided with a chelating group is introduced, as ion absorption film module 20, in branch piping 7 supplying cleaning tank 5 with ultra-pure water, but outside the cleaning machine, all the ultra-pure water being filtered by module 20 before introduction thereof into cleaning tank 5.

First, cleaning with ozone ultra-pure water in cleaning tank 1 through cleaning with dilute fluoric acid in cleaning tank 4 is performed upon a silicon wafer, prepared by a taking up method, of 8 inches in diameter (cz) and having an n-type crystal face (100) and a resistivity of 8 to 12 Ω·cm. Next, the cleaning is performed by changing the rinse time with the ultra-pure water in cleaning tank 5 from 10 minutes, 1 day, 3 days, to 7 days. After rinsing, the silicon wafer is dried, and the quantity of metal impurities such as copper, iron or nickel, among the deposited impurities, is measured by a total reflection X-ray spectrometer, the results thereof being shown in Table 1.

EXAMPLE 4

Figure 3:
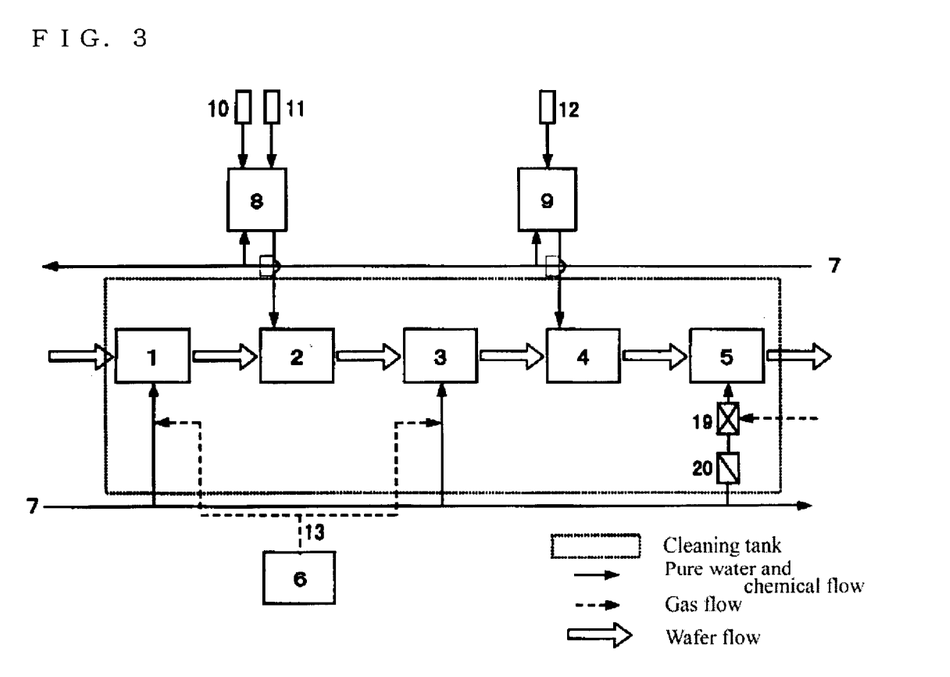
FIG. 3 is a schematic diagram showing a cleaning system used in Example 4.

A mixing tank 8 is installed in cleaning tank 2, and mixing tank 8 is suitably supplied with the necessary chemicals from a weighing tank 10 of fluoric acid containing surfactant and from a weighing tank 11 of hydrogen peroxide, and when mixing is finished, the chemicals are transported from mixing tank 8 to cleaning tank 2.

A mixing tank 9 is installed in cleaning tank 4, and mixing tank 9 is suitably supplied with the necessary chemicals from a weighing tank 12 of fluoric acid, and when mixing is finished, the chemicals are transported from mixing tank 9 to cleaning tank 4.

Cleaning tank 5 is supplied with ultra-pure water from ultra-pure water piping 7, the dissolved oxygen concentration of this ultra-pure water being 2 μg/L and the dissolved hydrogen concentration being 1 mg/L.

An anion absorption film module is introduced, as ion absorption film module 20, between a supply outlet to tank 5 and 0.1 μm particle elimination membrane filter 21 in branch piping 7 inside a cleaning machine supplying cleaning tank 5 with ultra-pure water, all the ultra-pure water being filtered by module 20 before introduction thereof into cleaning tank 5.

First, cleaning with ozone ultra-pure water in cleaning tank 1 through cleaning with dilute fluoric acid in cleaning tank 4 is performed upon a silicon wafer, prepared by a taking up method, of 8 inches in diameter (cz) and having an n-type crystal face (100) and a resistivity of 8 to 12 Ω·cm. Next, the cleaning is performed by changing the rinse time with the ultra-pure water in cleaning tank 5 from 10 minutes, 1 day, 3 days, to 7 days. After rinsing, the silicon wafer is dried, and the quantity of metal impurities such as copper, iron or nickel, among the deposited impurities, is measured by a total reflection X-ray spectrometer, the results thereof being shown in Table 2.

EXAMPLE 5

In the same cleaner as Example 4, a cation absorption film module is introduced as ion absorption film module 20, between the supply outlet to tank 5 and 0.1 μm particle elimination membrane filter 21 in branch piping 7 inside the cleaning machine, supplying cleaning tank 5 with ultra-pure water, all the ultra-pure water being filtered by module 20 before introduction thereof into cleaning tank 5.

First, cleaning with ozone ultra-pure water in cleaning tank 1 through cleaning with dilute fluoric acid in cleaning tank 4 is performed upon a silicon wafer, prepared by a taking up method, of 8 inches in diameter (cz) and having an n-type crystal face (100) and a resistivity of 8 to 12 Ω·cm. Next, the cleaning is performed by changing the rinse time with the ultra-pure water in cleaning tank 5 from 10 minutes, 1 day, 3 days, to 7 days. After rinsing, the silicon wafer is dried, and the quantity of metal impurities such as copper, iron or nickel, among the deposited impurities, is measured by a total reflection X-ray spectrometer, the results thereof being shown in Table 2.

EXAMPLE 6

In the same cleaner as Example 4, a film module having a chelating group is introduced, as ion absorption film module 20, between a supply outlet to tank 5 and 0.1 μm particle elimination membrane filter 21 in branch piping 7 inside the cleaning machine, supplying cleaning tank 5 with ultra-pure water, all the ultra-pure water being filtered by module 20 before introduction thereof into cleaning tank 5.

First, cleaning with ozone ultra-pure water in cleaning tank 1 through cleaning with dilute fluoric acid in cleaning tank 4 is performed upon a silicon wafer, prepared by a taking up method, of 8 inches in diameter (cz) and having an n-type crystal face (100) and a resistivity of 8 to 12 Ω·cm. Next, the cleaning is performed by changing the rinse time with the ultra-pure water in cleaning tank 5 from 10 minutes, 1 day, 3 days, to 7 days. After rinsing, the silicon wafer is dried, and the quantity of metal impurities such as copper, iron or nickel, among the deposited impurities, is measured by a total reflection X-ray spectrometer, the results thereof being shown in Table 2.

Comparative Example 5

In the same cleaner as Example 4, ultra-pure water is supplied without introducing an ion absorption module.

First, cleaning with ozone ultra-pure water in cleaning tank 1 through cleaning with dilute fluoric acid in cleaning tank 4 is performed upon a silicon wafer, prepared by a taking up method, of 8 inches in diameter (cz) and having an n-type crystal face (100) and a resistivity of 8 to 12 Ω·cm. Next, the cleaning is performed by changing the rinse time with the ultra-pure water in cleaning tank 5 from 10 minutes, 1 day, 3 days, to 7 days. After rinsing, the silicon wafer is dried, and the quantity of metal impurities such as copper, iron or nickel, among the deposited impurities, is measured by a total reflection X-ray spectrometer, the results thereof being shown in Table 2.

EXAMPLE 7

FIG. 3 shows an ambient temperature wet cleaning apparatus configured for performing a five-step cleaning process. Cleaning with ozone ultra-pure water is performed in cleaning tank 1, and megasonic irradiation cleaning is performed by adding surfactant to a fluoric acid-hydrogen peroxide mixture solution in cleaning tank 2. Cleaning is performed with ozone ultra-pure water in cleaning tank 3, a dilute fluoric acid treatment in cleaning tank 4, and a final ultra-pure water rinse in cleaning tank 5.

Cleaning tank 1 and cleaning tank 3 are supplied with ultra-pure water from ultra-pure water piping 7, ozone generated by an ozone generator 6 and ozone supplied from piping 13 are mixed and dissolved in the ultra-pure water piping 7 and supplied into the cleaning tank as ozone ultra-pure water.

Mixing tank 8 is installed in cleaning tank 2, and mixing tank 8 is suitably supplied with the necessary chemicals from weighing tank 10 of fluoric acid containing surfactant and from weighing tank 11 of hydrogen peroxide, and when mixing is finished, the chemicals are transported from mixing tank 8 to cleaning tank 2.

Mixing tank 9 is installed in cleaning tank 4, and mixing tank 9 is suitably supplied with the necessary chemicals from weighing tank 12 of fluoric acid, and when mixing is finished, the chemicals are transported from mixing tank 9 to cleaning tank 4.

Cleaning tank 5 is supplied with ultra-pure water from ultra-pure water piping 7, the dissolved oxygen concentration of this ultra-pure water being 2 μg/L.

An anion absorption film module is introduced, as ion absorption film module 20, between a supply outlet to cleaning tank 5 and the 0.1 μm particle elimination membrane filter in branch piping 7 inside a cleaning machine, supplying cleaning tank 5 with the ultra-pure water, then a hydrogen solved film module 19 using polyolefin hollow yarn is introduced.

Hydrogen gas is added so that the dissolved hydrogen concentration at hydrogen solved film module 19 becomes 1 mg/L.

First, cleaning with ozone ultra-pure water in cleaning tank 1 through cleaning with dilute fluoric acid in cleaning tank 4 is performed upon a silicon wafer, prepared by a taking up method, of 8 inches in diameter (cz) and having an n-type crystal face (100) and a resistivity of 8 to 12 Ω·cm. Next, the cleaning is performed by changing the rinse time with the ultra-pure water in cleaning tank 5 from 10 minutes, 1 day, 3 days, to 7 days. After rinsing, the silicon wafer is dried, and the quantity of metal impurities such as copper, iron or nickel, among the deposited impurities, is measured by a total reflection X-ray spectrometer, the results thereof being shown in Table 3.

EXAMPLE 8

In the same cleaner as Example 7, a cation absorption film module is introduced, as ion absorption film module 20, then hydrogen solved film module 19 using a polyolefin hollow yarn is introduced. Hydrogen gas is added so that dissolved hydrogen concentration at hydrogen solved film module 19 becomes 1 mg/L.

First, cleaning with ozone ultra-pure water in cleaning tank 1 through cleaning with dilute fluoric acid in cleaning tank 4 is performed upon a silicon wafer, prepared by a taking up method, of 8 inches in diameter (cz) and having an n-type crystal face (100) and a resistivity of 8 to 12 Ω·cm. Next, the cleaning is performed by changing the rinse time with the ultra-pure water in cleaning tank 5 from 10 minutes, 1 day, 3 days, to 7 days. After rinsing, the silicon wafer is dried, and the quantity of metal impurities such as copper, iron or nickel, among the deposited impurities, is measured by a total reflection X-ray spectrometer, the results thereof being shown in Table 3.

EXAMPLE 9

In the same cleaner as Example 1, a film module having chelating group is introduced, as ion absorption film module 20, then a hydrogen solved film module 19 using a polyolefin hollow yarn is introduced. Hydrogen gas is added so that the dissolved hydrogen concentration at hydrogen solved film module 19 becomes 1 mg/L.

First, cleaning with ozone ultra-pure water in cleaning tank 1 through cleaning with dilute fluoric acid in cleaning tank 4 is performed upon a silicon wafer, prepared by a taking up method, of 8 inches in diameter (cz) and having an n-type crystal face (100) and a resistivity of 8 to 12 Ω·cm. Next, the cleaning is performed by changing the rinse time with the ultra-pure water in cleaning tank 5 from 10 minutes, 1 day, 3 days, to 7 days. After rinsing, the silicon wafer is dried, and the quantity of metal impurities such as copper, iron or nickel, among the deposited impurities, is measured by a total reflection X-ray spectrometer, the results thereof being shown in Table 3.

Comparative Example 6

In the same cleaner as Example 7, a hydrogen solved film module 19 using a polyolefin hollow yarn is introduced, without installing an ion absorption module 20 in piping 7 supplying cleaning tank 5. Hydrogen gas is added so that the dissolved hydrogen concentration at the hydrogen solved film module 19 becomes 1 mg/L.

First, cleaning with ozone ultra-pure water in cleaning tank 1 through cleaning with dilute fluoric acid in cleaning tank 4 is performed upon a silicon wafer, prepared by a taking up method, of 8 inches in diameter (cz) and having an n-type crystal face (100) and a resistivity of 8 to 12 Ω·cm. Next, the cleaning is performed by changing the rinse time with the ultra-pure water in cleaning tank 5 from 10 minutes, 1 day, 3 days, to 7 days. After rinsing, the silicon wafer is dried, and the quantity of metal impurities such as copper, iron or nickel, among the deposited impurities, is measured by a total reflection X-ray spectrometer, the results thereof being shown in Table 3.

EXAMPLE 10

Figure 4:
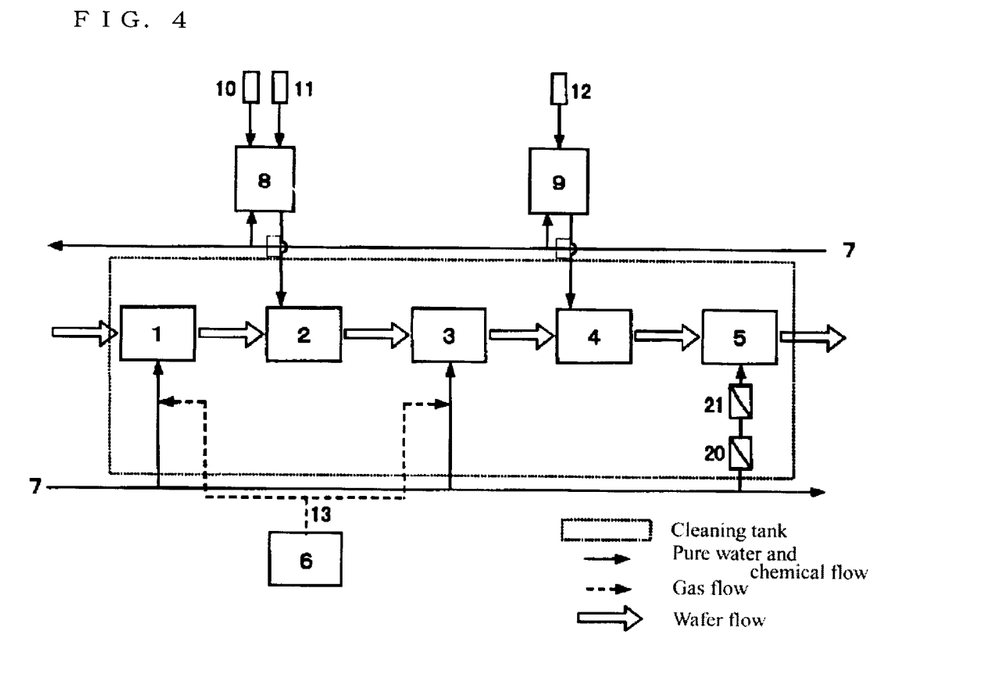
FIG. 4 is a schematic diagram showing a cleaning system used in Example 10.

FIG. 4 shows an ambient temperature wet cleaning apparatus for facilitating a five-step wet cleaning process. Cleaning with ozone ultra-pure water is performed in cleaning tank 1 and megasonic irradiation cleaning is performed by adding a surfactant to a fluoric acid-hydrogen peroxide mixture solution in cleaning tank 2.

Cleaning is performed with ozone ultra-pure water in cleaning tank 3, a dilute fluoric acid treatment in cleaning tank 4, and a final ultra-pure water rinse in cleaning tank 5.

Cleaning tank 1 and cleaning tank 3 are supplied with ultra-pure water from ultra-pure water piping 7. Ozone generated by ozone generator 6 and ozone supplied from piping 13 are mixed and dissolved in the ultra-pure water within piping 7 and supplied into cleaning tank 5 as ozone ultra-pure water.

Mixing tank 8 is installed in cleaning tank 2, and mixing tank 8 is suitably supplied with the necessary chemicals from weighing tank 10 of fluoric acid containing a surfactant and from weighing tank 11 of hydrogen peroxide, and when mixing is finished, the chemicals are transported from mixing tank 8 to cleaning tank 2.

Mixing tank 9 is installed in cleaning tank 4, and mixing tank 9 is suitably supplied with the necessary chemicals from weighing tank 12 of fluoric acid, and when mixing is finished, the chemicals are transported from mixing tank 9 to cleaning tank 4.

Cleaning tank 5 is supplied with ultra-pure water from ultra-pure water piping 7, the dissolved oxygen concentration of this ultra-pure water being 2 μg/L.

A cation absorption film module 20 is introduced, between a supply outlet to tank 5 and 0.1 μm particle elimination membrane filter 21 in branch piping 7 inside a cleaning machine, supplying cleaning tank 5 with ultra-pure water, then anion absorption film module 21 is introduced, all the ultra-pure water being filtered by modules 20,21 before being introduced into cleaning tank 5.

An MOS diode of gate oxide film thickness (4.5 nm) is prepared, using this cleaning machine. A dielectric breakdown characteristic test of the MOS diode is performed on a device having a device area of $1 \times 10^{-4}$ cm$^2$ and a control current value of $1 \times 10^{-4}$ A to investigate the average value of dielectric breakdown voltage of the device (device number 100), the results thereof being shown in Table 4.

EXAMPLE 11

In the same cleaner as Example 10, a chelate absorption film module 20 is introduced, between a supply outlet to tank 5 and 0.1 μm particle elimination membrane filter 21 in branch piping 7 inside a cleaning machine, supplying cleaning tank 5 with ultra-pure water and then introducing anion absorption film module 21, all the ultra-pure water being filtered by modules 21 before being introduced into cleaning tank 5.

An MOS diode of gate oxide film thickness (4.5 nm) is prepared, using this cleaning machine. A dielectric breakdown characteristic test of the MOS diode is performed on a device having a device area of $1 \times 10^{-4}$ cm$^2$ and a control current value of $1 \times 10^{-4}$ A to investigate the average value of dielectric breakdown voltage of the device (device number 100), the results thereof being shown in Table 4.

EXAMPLE 12

In the same cleaner as Example 10, a anion absorption film module 20 is introduced, between a supply outlet to tank 5 and 0.1 μm particle elimination membrane filter 22 in branch piping 7 inside a cleaning machine, supplying cleaning tank 5 with ultrapure water and then introducing a chelate absorption film module 21, all the ultra-pure water being filtered by modules 20,21 before being introduced into cleaning tank 5.

An MOS diode of gate oxide film thickness (4.5 nm) is prepared, using this cleaning machine. A dielectric breakdown characteristic test of the MOS diode is performed on a device having a device area of $1 \times 10^{-4}$ cm$^2$ and a control current value of $1 \times 10^{-4}$ A to investigate the average value of dielectric breakdown voltage of the device (device number 100), the results thereof being shown in Table 4.

EXAMPLE 13

In the same cleaner as Example 10, a cation absorption film module 20 is introduced, between a supply outlet to tank 5 and 0.1 μm particle elimination membrane filter 22 in branch piping 7 inside a cleaning machine, supplying cleaning tank 5 with ultra-pure water and then introducing a chelate absorption film module 21, all the ultra-pure water being filtered by modules 20,21 before being introduced into cleaning tank 5.

An MOS diode of gate oxide film thickness (4.5 nm) is prepared, using this cleaning machine. A dielectric breakdown characteristic test of the MOS diode is performed on a device having a device area of $1 \times 10^{-4}$ cm$^2$ and a control current value of $1 \times 10^{-4}$ A to investigate the average value of dielectric breakdown voltage of the device (device number 100), the results thereof being shown in Table 4.

EXAMPLE 14

In the same cleaner as Example 10, only an anion absorption film module 20 is introduced, between a supply outlet to tank 1 and the 0.1 μm particle elimination membrane filter 22 in branch piping 7 inside a cleaning machine, supplying cleaning tank 5 with ultra-pure water, and all the ultra-pure water being filtered by these modules before being introduced into cleaning tank 5.

An MOS diode of gate oxide film thickness (4.5 nm) is prepared, using this cleaning machine. The dielectric breakdown characteristic test of the prepared MOS diode (the MOS diode having a device area of $1 \times 10^{-4}$ cm$^2$, a control current value of $1 \times 10^{-4}$ A) to investigate the average value of dielectric breakdown voltage of the device (device number 100), the results thereof being shown in Table 4.

EXAMPLE 15

Figure 5:
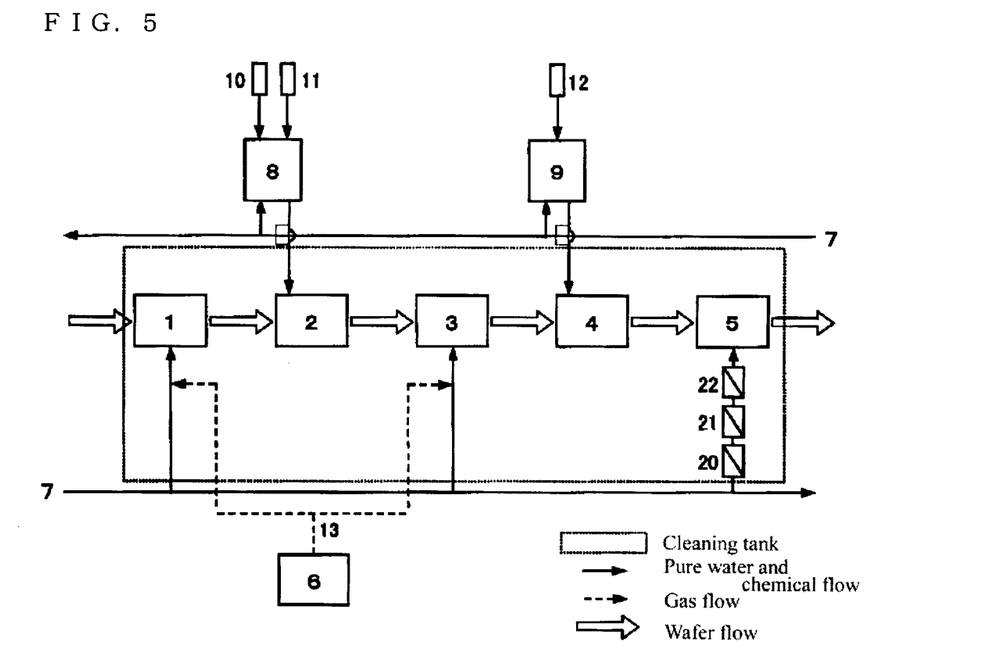
FIG. 5 is a schematic diagram showing a cleaning system used in Example 15.

FIG. 5 shows an ambient temperature wet cleaning apparatus for facilitating a five-step cleaning process. Cleaning with ozone ultra-pure water is performed in cleaning tank 1, and megasonic irradiation cleaning is performed by adding a surfactant to a fluoric acid-hydrogen peroxide mixture solution in cleaning tank 2.

Cleaning is performed with ozone ultra-pure water in cleaning tank 3, a dilute fluoric acid treatment in cleaning tank 4, and a final ultra-pure water rinse in cleaning tank 5.

Cleaning tank 1 and cleaning tank 3 are supplied with ultra-pure water from ultra-pure water piping 7. Ozone generated by ozone generator 6 and ozone supplied from piping 13 are mixed and dissolved in the ultra-pure water within piping 7 and supplied into cleaning tank 5 as ozone ultra-pure water.

Mixing tank 8 is installed in cleaning tank 2, and mixing tank 8 is suitably supplied with necessary chemicals from weighing tank 10 of fluoric acid containing the surfactant and from weighing tank 11 of hydrogen peroxide, and when mixing is finished, the chemicals are transported from mixing tank 8 to cleaning tank 2.

Mixing tank 9 is installed in cleaning tank 4, and mixing tank 9 is suitably supplied with the necessary chemicals from weighing tank 12 of fluoric acid, and when mixing is finished, the chemicals are transported from mixing tank 9 to cleaning tank 4.

Cleaning tank 5 is supplied with ultra-pure water from ultra-pure water piping 7, the dissolved oxygen concentration of this ultra-pure water being 2 μg/L.

A cation absorption film module 20 is introduced, between a supply outlet to tank 5 and 0.1 μm particle elimination membrane filter 21 in a branch piping 7 inside a cleaning machine, supplying cleaning tank 5 with ultra-pure water, then a film module 21 provided with a chelating group and further an anion absorption film module 22 are introduced, all the ultra-pure water being filtered by these modules before being introduced into cleaning tank 5.

An MOS diode of gate oxide film thickness (3.5 nm) is prepared, using this cleaning machine. A dielectric breakdown characteristic test of the MOS diode is performed on a device having a device area of $1 \times 10^{-4}$ cm$^2$ and a control current value of $1 \times 10^{-4}$ A to investigate the average value of dielectric breakdown voltage of the device (device number 100), the results thereof being shown in Table 5.

EXAMPLE 16

In the same cleaner as Example 14, a film module 20 provided with a chelating group is introduced, between a supply outlet to tank 5 and 0.1 μm particle elimination membrane filter 21 in branch piping 7 inside a cleaning machine, supplying cleaning tank 5 with ultra-pure water, then a cation absorption film module 21 and further an anion absorption film module 22 are introduced, all the ultra-pure water being filtered by these modules before being introduced into cleaning tank 5.

An MOS diode of gate oxide film thickness (3.5 nm) is prepared, using this cleaning machine.

A dielectric breakdown characteristic test of the MOS diode is performed on a device having a device area of $1 \times 10^{-4}$ cm$^2$ and a control current value of $1 \times 10^{-4}$ A to investigate the average value of the dielectric breakdown voltage of the device (device number 100), the results thereof being shown in Table 5.

EXAMPLE 17

In the same cleaner as Example 14, a film module 20 provided with a chelating group is introduced, between a supply outlet to thank 5 and 0.1 μparticle elimination membrane filter 21 in branch piping 7 inside a cleaning machine, supplying cleaning tank 5 with ultra-pure water, then an anion absorption film module 21 and further a cation absorption film module 22 are introduced, all the ultra-pure water is filtered by these modules before being introduced into cleaning tank 5.

An MOS diode of gate oxide film thickness (3.5 nm) is prepared, using this cleaning machine. The dielectric breakdown characteristic test of the MOS diode is performed on a device having a device area of $1 \times 10^{-4}$ cm$^2$ and a control current value of $1 \times 10^{-4}$ A to investigate the average value of the dielectric breakdown voltage of the device (device number 100), the results thereof being shown in Table 5.

EXAMPLE 18

In the same cleaner as Example 14, a cation absorption film module 20 is introduced, between a supply outlet to tank 5 and 0.1 μm particle elimination membrane filter 21 in branch piping 7 inside a cleaning machine, supplying cleaning tank 5 with ultra-pure water, then an anion absorption film module 21 and further a film module 22 provided with chelating group are introduced the ultra-pure water being filtered by these modules before being introduced into cleaning tank 5.

An MOS diode of gate oxide film thickness (3.5 nm) is prepared, using this cleaning machine. The dielectric breakdown characteristic test of the MOS diode is performed on a device having a device area of $1 \times 10^{-4}$ cm$^2$ and a control current value of $1 \times 10^{-4}$ A to investigate the average value of the dielectric breakdown voltage of the device (device number 100), the results thereof being shown in Table 5.

EXAMPLE 19

In the same cleaner as Example 10, a anion absorption film module 20 is introduced, between a supply outlet to tank 5 and 0.1 μm particle elimination membrane filter 21 in branch piping 7 inside a cleaning machine, supplying cleaning tank 5 with ultra-pure water, then a cation absorption film module 22 is introduced, all the ultra-pure water being filtered by these modules before being introduced into cleaning tank 5.

An MOS diode of gate oxide film thickness (4.5 nm) is prepared, using this cleaning machine.

A dielectric breakdown characteristic test of the MOS diode is performed on a device having a device area of $1\times10^{-4}$ cm$^2$ and a control current value of $1\times10^{-4}$ A to investigate the average value of the dielectric breakdown voltage of the device (device number 100), the results thereof being shown in Table 5.

TABLE 1

Amount of metal deposited onto silicon wafer (unit: $\times10^9$ atoms/cm$^2$)

| | Copper | Iron | Nickel |
|---|---|---|---|
| | Before Rinse | | |
| Example 1 | quantification lower limit or less | quantification lower limit or less | quantification lower limit or less |
| Example 2 | quantification lower limit or less | quantification lower limit or less | quantification lower limit or less |
| Example 3 | quantification lower limit or less | quantification lower limit or less | quantification lower limit or less |
| Comparison 1 | quantification lower limit or less | quantification lower limit or less | quantification lower limit or less |
| Comparison 2 | quantification lower limit or less | quantification lower limit or less | quantification lower limit or less |
| Comparison 3 | quantification lower limit or less | quantification lower limit or less | quantification lower limit or less |
| Comparison 4 | quantification lower limit or less | quantification lower limit or less | quantification lower limit or less |
| | 10 minute rinse | | |
| Example 1 | quantification lower limit or less | quantification lower limit or less | quantification lower limit or less |
| Example 2 | quantification lower limit or less | quantification lower limit or less | quantification lower limit or less |
| Example 3 | quantification lower limit or less | quantification lower limit or less | quantification lower limit or less |
| Comparison 1 | quantification lower limit or less | quantification lower limit or less | quantification lower limit or less |
| Comparison 2 | quantification lower limit or less | quantification lower limit or less | quantification lower limit or less |
| Comparison 3 | quantification lower limit or less | quantification lower limit or less | quantification lower limit or less |
| Comparison 4 | quantification lower limit or less | quantification lower limit or less | quantification lower limit or less |
| | 1 day rinse | | |
| Example 1 | quantification lower limit or less | quantification lower limit or less | quantification lower limit or less |
| Example 2 | quantification lower limit or less | quantification lower limit or less | quantification lower limit or less |
| Example 3 | quantification lower limit or less | quantification lower limit or less | quantification lower limit or less |
| Comparison 1 | 4.1 | 9.7 | quantification lower limit or less |
| Comparison 2 | quantification lower limit or less | quantification lower limit or less | quantification lower limit or less |
| Comparison 3 | quantification lower limit or less | quantification lower limit or less | quantification lower limit or less |
| Comparison 4 | quantification lower limit or less | quantification lower limit or less | quantification lower limit or less |
| | 3 day rinse | | |
| Example 1 | quantification lower limit or less | quantification lower limit or less | quantification lower limit or less |
| Example 2 | quantification lower limit or less | quantification lower limit or less | quantification lower limit or less |
| Example 3 | quantification lower limit or less | quantification lower limit or less | quantification lower limit or less |
| Comparison 1 | 12 | 40 | 4.9 |
| Comparison 2 | quantification lower limit or less | 5.7 | quantification lower limit or less |
| Comparison 3 | 2.5 | 11 | quantification lower limit or less |
| Comparison 4 | quantification lower limit or less | 3.8 | quantification lower limit or less |
| | 7 day rinse | | |
| Example 1 | quantification lower limit or less | 5.8 | quantification lower limit or less |
| Example 2 | 2.9 | 3.2 | quantification lower limit or less |
| Example 3 | 3.3 | 3.5 | quantification lower limit or less |
| Comparison 1 | 30 | 89 | 12 |
| Comparison 2 | 5.8 | 18 | quantification lower limit or less |
| Comparison 3 | 8.3 | 20 | 3.0 |
| Comparison 4 | 6 | 11 | 4.3 |

Copper quantification lower limit: $1.8\times10^9$ atoms/cm$^2$
Iron quantification lower limit: $3.2\times10^9$ atoms/cm$^2$
Nickel quantification lower limit: $2.0\times10^9$ atoms/cm$^2$

TABLE 2

Amount of metal deposited onto silicon wafer (unit: $\times10^9$ atoms/cm$^2$)

| | Copper | Iron | Nickel |
|---|---|---|---|
| | Before Rinse | | |
| Example 4 | quantification lower limit or less | quantification lower limit or less | quantification lower limit or less |
| Example 5 | quantification lower limit or less | quantification lower limit or less | quantification lower limit or less |
| Example 6 | quantification lower limit or less | quantification lower limit or less | quantification lower limit or less |
| Comparison 5 | quantification lower limit or less | quantification lower limit or less | quantification lower limit or less |
| | 10 minute rinse | | |
| Example 4 | quantification lower limit or less | quantification lower limit or less | quantification lower limit or less |
| Example 5 | quantification lower limit or less | quantification lower limit or less | quantification lower limit or less |

TABLE 2-continued

Amount of metal deposited onto silicon wafer (unit: ×10⁹ atoms/cm²)

| | Copper | Iron | Nickel |
|---|---|---|---|
| Example 6 | quantification lower limit or less | quantification lower limit or less | quantification lower limit or less |
| Comparison 5 | quantification lower limit or less | quantification lower limit or less | quantification lower limit or less |
| 1 day rinse | | | |
| Example 4 | quantification lower limit or less | quantification lower limit or less | quantification lower limit or less |
| Example 5 | quantification lower limit or less | quantification lower limit or less | quantification lower limit or less |
| Example 6 | quantification lower limit or less | quantification lower limit or less | quantification lower limit or less |
| Comparison 5 | 20 | 6.4 | quantification lower limit or less |
| 3 day rinse | | | |
| Example 4 | quantification lower limit or less | quantification lower limit or less | quantification lower limit or less |
| Example 5 | quantification lower limit or less | quantification lower limit or less | quantification lower limit or less |
| Example 6 | quantification lower limit or less | quantification lower limit or less | quantification lower limit or less |
| Comparison 5 | 32 | 10.5 | 2.7 |
| 7 day rinse | | | |
| Example 4 | quantification lower limit or less | quantification lower limit or less | quantification lower limit or less |
| Example 5 | 3.1 | 3.2 | quantification lower limit or less |
| Example 6 | quantification lower limit or less | quantification lower limit or less | quantification lower limit or less |
| Comparison 5 | 74 | 21 | 6.3 |

Copper quantification lower limit: $1.8 \times 10^9$ atoms/cm²
Iron quantification lower limit: $3.2 \times 10^9$ atoms/cm²
Nickel quantification lower limit: $2.0 \times 10^9$ atoms/cm²

TABLE 3

Amount of metal deposited onto silicon wafer (unit: ×10⁹ atoms/cm²)

| | Copper | Iron | Nickel |
|---|---|---|---|
| Before rinse | | | |
| Example 7 | quantification lower limit or less | quantification lower limit or less | quantification lower limit or less |
| Example 8 | quantification lower limit or less | quantification lower limit or less | quantification lower limit or less |
| Example 9 | quantification lower limit or less | quantification lower limit or less | quantification lower limit or less |
| Comparison 6 | quantification lower limit or less | quantification lower limit or less | quantification lower limit or less |
| 10 minute rinse | | | |
| Example 7 | quantification lower limit or less | quantification lower limit or less | quantification lower limit or less |
| Example 8 | quantification lower limit or less | quantification lower limit or less | quantification lower limit or less |
| Example 9 | quantification lower limit or less | quantification lower limit or less | quantification lower limit or less |
| Comparison 6 | quantification lower limit or less | quantification lower limit or less | quantification lower limit or less |
| 1 day rinse | | | |
| Example 7 | quantification lower limit or less | quantification lower limit or less | quantification lower limit or less |
| Example 8 | quantification lower limit or less | quantification lower limit or less | quantification lower limit or less |
| Example 9 | quantification lower limit or less | quantification lower limit or less | quantification lower limit or less |
| Comparison 6 | 3 | 9.1 | quantification lower limit or less |
| 3 day rinse | | | |
| Example 7 | quantification lower limit or less | 3.2 | quantification lower limit or less |
| Example 8 | quantification lower limit or less | 3.2 | quantification lower limit or less |
| Example 9 | quantification lower limit or less | quantification lower limit or less | quantification lower limit or less |
| Comparison 6 | 10 | 33 | 4.9 |
| 7 days rinse | | | |
| Example 7 | quantification lower limit or less | 3.2 | quantification lower limit or less |
| Example 8 | quantification lower limit or less | 3.2 | quantification lower limit or less |
| Example 9 | quantification lower limit or less | quantification lower limit or less | quantification lower limit or less |
| Comparison 6 | 10 | 33 | 4.9 |

Copper quantification lower limit: $1.8 \times 10^9$ atoms/cm²
Iron quantification lower limit: $3.2 \times 10^9$ atoms/cm²
Nickel quantification lower limit: $2.0 \times 10^9$ atoms/cm²

TABLE 4

Dielectric breakdown characteristic test of MOS diode
(Average of 100 devices)
(Unit: MV/cm)

| | Example 10 | Example 11 | Example 12 | Example 13 | Example 14 |
|---|---|---|---|---|---|
| Dielectric breakdown electric field | 12.0 | 12.2 | 12.3 | 12.2 | 10.4 |

Gate oxide film thickness: 45 Å
Device area: $1 \times 10^{-4}$ cm²
Control current value: $1 \times 10^{-4}$ A

TABLE 5

Dielectric breakdown characteristic test cf MOS diode
(Average of 100 devices)
(Unit : MV/cm)

| | Example 15 | Example 16 | Example 17 | Example 18 | Example 19 |
|---|---|---|---|---|---|
| Dielectric breakdown electric field | 11.5 | 11.3 | 11.7 | 11.5 | 9.5 |

Gate oxide film thickness: 45 Å
Device area: $1\times10^{-4}$ cm$^2$
Control current value: $1\times10^{-4}$ A Possible Industrial Applications The cleaning process of the present invention can be used to remove clustered metal (silica, clustered with organic matter lowering electric charge) that can not be removed with conventional ultra-pure water production apparatus and can be used to reduce the amount of metal deposition onto the substrate during wet processing, especially during the rinse phase.

As the amount of metal deposition onto the substrate can be reduced, reduction of device defect (fail bit) due to wet processing is expected.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A wet cleaning apparatus for rinsing with ultra-pure water as a rinse liquid comprising:

a piping for supplying therethrough ultra-pure water to a rinse location inside the apparatus, the rinse location being a point of use of the ultra-pure water;

at least one module filled with porous film in which polymer chains having at least one of an anion exchange group, a cation exchange group, and a chelating group are held in the middle of the piping positioned inside the apparatus; and a means for adding hydrogen gas to said rinse liquid said means for adding being an introduction module associated with the piping.

2. The wet cleaning apparatus of claim 1, wherein said hydrogen gas adding means is provided one of upstream and downstream said module.

3. The wet cleaning apparatus of claim 1, wherein said hydrogen gas adding means is provided downstream said module.

4. The wet cleaning apparatus on claim 1, having a combination of any two or more modules filled with at least one of a polymer-chain-holding porous film having an anion exchange group, a polymer-chain-holding porous film having a cation exchange group and a polymer-chain-holding porous film having a chelating group is provided.

* * * * *